United States Patent [19]

Wilcox

[11] 3,755,719

[45] Aug. 28, 1973

[54] SEMICONDUCTOR ASSEMBLY

[75] Inventor: Lance C. Wilcox, Wilton, Conn.

[73] Assignee: Electric Regulator Corporation, Norwalk, Conn.

[22] Filed: Aug. 26, 1971

[21] Appl. No.: 175,317

Related U.S. Application Data

[62] Division of Ser. No. 887,542, Dec. 23, 1969, Pat. No. 3,661,013.

[52] U.S. Cl. ..... 317/234 R, 317/234 A, 317/234 P, 317/234 W

[51] Int. Cl. .......................... H01l 3/00, H01l 5/00

[58] Field of Search .................... 317/234, 1, 6, 11

[56] References Cited

UNITED STATES PATENTS

| | | | |
|---|---|---|---|
| 3,293,508 | 12/1966 | Boyer | 317/234 P |
| 3,413,532 | 11/1968 | Boyer | 317/234 P |
| 3,619,473 | 11/1971 | Meyerhoff | 317/234 A |
| 3,624,452 | 11/1971 | Hayward | 317/234 A |

*Primary Examiner*—John W. Huckert
*Assistant Examiner*—Andrew J. James
*Attorney*—James and Franklin

[57] ABSTRACT

A semiconductor assembly comprises a semiconductor component, a body operatively connected to the semiconductor component, a force generating means operatively connected to the body and effective to force the body and the semiconductor into engagement, and means operatively connected to the force generating means and effective to vary its position. The change in position of the end sections is controlled by bolts which pass through the end sections and the body and are operatively connected to the semiconductor component. An insulating guide tube encloses each bolt and an insulating member partially supports each bolt head. The insulating members are effective to withstand the pressures generated by the adjustment of the bolts as well as electrically insulate the bolt heads.

4 Claims, 3 Drawing Figures

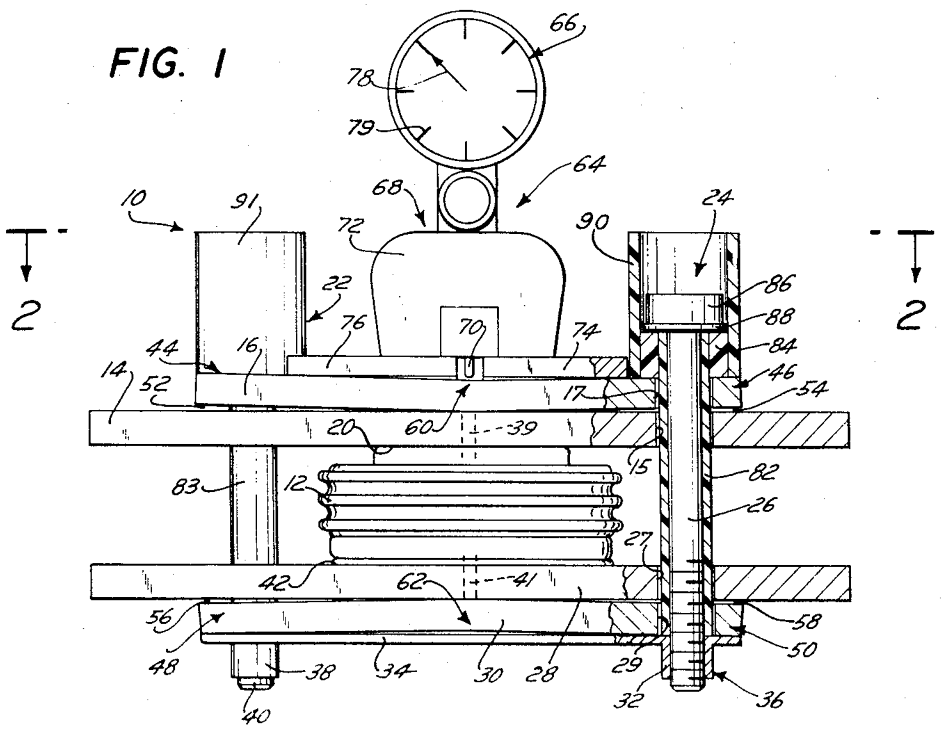
FIG. 1
FIG. 2
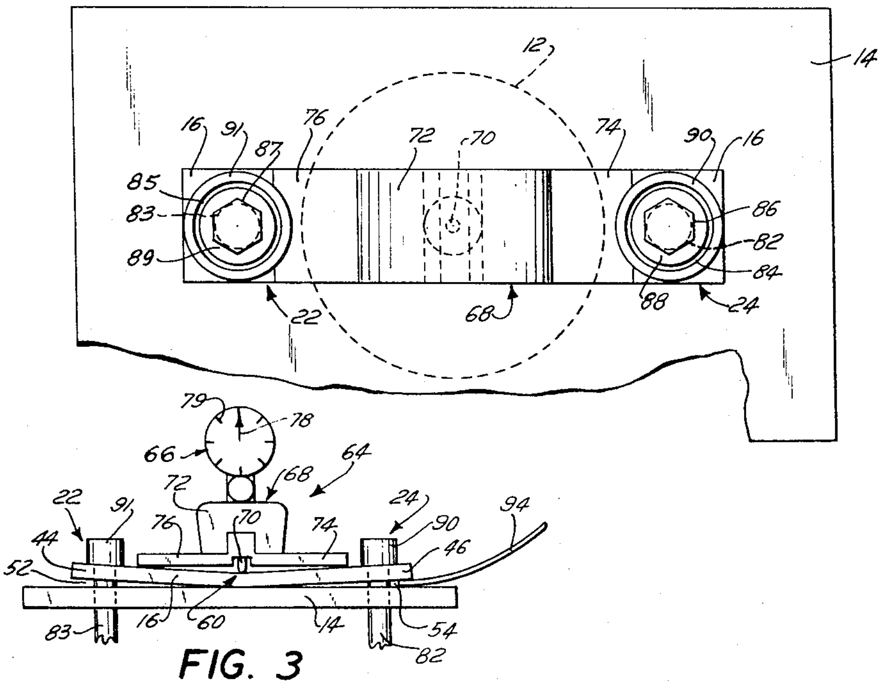
FIG. 2, FIG. 3

SEMICONDUCTOR ASSEMBLY

This application is a division of my application Ser. No. 887,542, filed Dec. 23, 1969 entitled "Semiconductor Assembly With Force Measuring Means," now U.S. Pat. No. 3,661,013.

This invention relates to semiconductor assembies, and more specifically to an assembly in which an accurate pressurized contact between a semiconductor component and a body such as a thermal conductor is obtained.

Semiconductor components have a high heat generating character which requires that they be properly packaged and assembled in a suitable heat dissipating environment. The heat which is generated occurs as an inherent result of the passage of current through these components. Efficient heat dissipation in virtually every semiconductor circuit must be carefully achieved for the proper operation and continued life of the components and the circuit.

Generally a semiconductor component is directly connected to a thermally conductive element such as a heat sink plate which is effective to draw heat directly from the component. A wide variety of heat sink devices in a number of configurations are currently available for this purpose. Usually the semiconductor component is attached to the heat sink device by any suitable locking means such as a conventional bolt and nut. In order to further ensure the proper dissipation of the heat through these components, a second heat sink plate is generally connected to the semiconductor unit on the surface opposite to the first heat sink plate. Normally the connection to both plates is made by positioning the semiconductor component between plates and employing the same locking means to compress the component between plates.

The degree of compressive force which is applied to the component and the thermal conductor to which it is attached is important to ensure a proper dissipation of the heat. Not only must the force be applied in a direction which is effective to ensure continued and full contact between the components, but it must be of a magnitude sufficient to give proper contact and yet not adversely affect the sensitive structure of the semiconductor component. It is difficult, however, to ensure the proper magnitude of force between these components because of the difficulty of accurately measuring the applied force. A suitable force is usually achieved by a trial and error procedure which depends in large part upon the proper manipulation of the locking means holding the components together. Obviously such a method is inefficient for large scale manufacturing production, since trial and error cannot be economically employed in such situations. Furthermore, a large number of components are destroyed because of the excessive compressive force applied when the component is attached to a heat sink device during the trial and error process.

It is the primary object of this invention to provide a means and method of accurately adjusting the applied force in a pressurized joint between components in a semiconductor assembly.

It is still another object of this invention to provide a combination of the semiconductor assembly and a force measuring instrument which is operatively connected to the assembly in such a manner as to provide an accurate indication of the force applied between components at all times during the pressure adjusting procedure.

A further object of the invention is to provide a semiconductor assembly which is characterized by a high degree of electrical insulation between components.

Broadly, the objects of the invention are achieved by a semiconductor assembly comprising a semiconductor component, a first body operatively engaging the semiconductor component, force generating means operatively connected to the body and effective to force the body and the semiconductor component into a pressurized engagement, and means operatively connected to the force generating means and effective to vary the position of the force generating means, thereby to vary the force between the body and semiconductor in the assembly. A force measuring means is combined with the semiconductor assembly by being operatively connected to the force generating means. The force measuring means is effective to measure the applied force in response to the change in position of the force generating means.

In the preferred embodiment, the force generating means comprises a curved resilient member which at its lowered central section engages a surface of a thermally conductive plate, and which at its raised end sections is spaced therefrom. The means to vary the force between the semiconductor component and the conductive plate may comprise first and second control means operatively connected at one end to the resilient member at each end section and at the other end to the semiconductor. Adjustment of control means such as by turning a bolt causes the space between the end sections of the resilient member and the conductive plate to be increased or decreased in accordance with a desired force increase or decrease. Since the end sections of the resilient member are spaced from the conductive plate, and the central section is operatively connected to it, a variation in spacing at the end sections will cause a variation in the applied force provided by the resilient member substantially solely at its central section. By properly positioning the semiconductor component in alignment with the central section of the resilient member and in engagement with the conductive plate, the applied force is directed substantially axially of the semiconductor unit in a direction which tends to press together the semiconductor component and the conductive plate. A second conductive plate may be positioned on the opposite surface of the semiconductor component to form an assembly support and to further ensure the dissipation of heat from the component. In addition, a second resilient member may be placed in engagement with the second conductive plate and the entire assembly may be held together by the control means.

The semiconductor assembly is combined with a force measuring means which is responsive to the movement of the force generating means, and which provides an output indication of the change in force due to this movement. In the preferred form the force measuring means comprises a visual indicator such as a gauge or the like which is operatively connected to a projecting part such as a plunger. The indicating means and projecting part are operatively connected to a reference structure and the readout of the indicating means is proportional to the movement of the plunger relative to the reference structure. The measuring means is operatively connected to the semiconductor assembly by placing the reference structure in contact with the raised end sections of the resilient member. When the end sections of the resilient member are caused to change position by an adjustment of the control means, the reference structure follows the movement of the raised end sections to which it is connected. The projecting part remains stationary at the central lowered section of the resilient member and thus the relative movement of the part and the reference structure is effective to vary the readout on the indicating means.

The semiconductor assembly is further characterized by being open in its finally assembled condition, that is, no housing or other enclosing support structure is included. This permits the use and ready placement of the force measuring means in the assembly. In addition, access to and observation of the components in the system is facilitated.

In order to protect the semiconductor component from high electrical voltages which may be applied during the operation of the semiconductor in an electrical circuit, the control means employed to attach the conductive plate to the resilient member and adjust the pressure on the semiconductor is characterized by a plurality of parts which insulate the electrically conductive components in the assembly. The control means preferably comprises a bolt which extends through aligned apertures in the resilient member and the conductive plate, and continues for a distance sufficient to extend through aligned apertures in a second resilient member and a second conductive plate positioned on the opposite surface of the semiconductor component. A guide tube composed of a material which is able to provide a proper electrical dielectric strength between thermal conductor plates guides the elongated bolt during the adjustment procedure. An insulative member is operatively connected to the guide tube and positioned substantially directly below the bolt head on one surface of a resilient member. This flanged member is in operative engagement with the resilient member and is effective to transmit the force supplied by the bolt head during a minipulation thereof as well as insulating the bolt head from the remainder of the assembly. A third part comprising a second tube extends upwardly and encloses the bolt head. This tube is employed to provide a larger area of insulating material to reduce the possibility of electrical arcing which may occur as a result of the high voltage potentials between components in the assembly. The several parts are each made of material appropriate to its particular function.

To the accomplishment of the foregoing, and to such other objects as may hereinafter appear, the subject invention is directed to a semiconductor assembly as described in the appended claims, and as illustrated in the accompanying drawings in which:

FIG. 1 is a front elevational view partly in section of the semiconductor assembly in combination with a force measuring instrument;

FIG. 2 is a fragmented plan view taken on line 2—2 of FIG. 1; and

FIG. 3 is a schematic illustration in front elevation of the initial position of the force measuring instrument in the assembly illustrated in FIG. 1.

Referring to the drawing, and specifically to FIG. 1 there is illustrated a semiconductor assembly generally designated 10 comprising a semiconductor component 12, a first thermally conductive body 14 and a curved resilient member 16. The semiconductor component 12 contacts the body 14 at the joint 20. Pressure is applied to the components at this joint by the resilient member 16 and the force is varied by control means generally designated by the numerals 22 and 24. As illustrated with respect to control means 24, a bolt 26 extends downwardly through the apertures 15, 17 in the conductive body 14 and the resilient member 16 respectively. The bolt 26 also extends through an aperture 27 in a second conductive body 28 and an aperture 29 in a second curved resilient member 30. A locking nut 32 is attached to a supporting plate 34 and receives the bolt 26 in the threaded section 36. A similar nut 38 is attached to the plate 34 to receive bolt 40 of control means 22 in a similar manner. Contact between the semiconductor component 12 and the body 28 occurs at the joint 42 which is also placed under pressure by the force generated by resilient member 30. Guide pins 39 and 41 centralize and align the semiconductor 12 in the assembly.

FIG. 2 illustrates the resilient member 16 as an elongated strip which may be composed of a material such as carbon steel. This member 16 is the force generating means which is employed to impart a force between the semiconductor component 12 and the thermally conductive body 14. Similarly the resilient member 30, which may be of substantially the same construction as the member 16, is effective to apply a force between the thermal body 28 and the semiconductor component 12 at the joint 42. These forces are varied by the manipulation of the control means 22 and 24. The rotation of the bolts 26 and 40 will cause the raised end sections 44, 46 and 48, 50 of the resilient members 16 and 30 respectively to be drawn toward or away from the adjacent bodies 14 and 28. This end movement is effective to vary the force at the joints 20, 42 axially of the semiconductor 12.

Referring again to FIG. 1, it will be noted that the resilient members 16 and 30 are spaced at their end sections 44, 46 and 48, 50 respectively from the thermal bodies 14 and 28. For example, spaces 52 and 54 are provided between the end sections 44 and 46 of resilient member 16 and the body 14. Similarly, spaces 56 and 58 are provided between the end sections 48 and 50 of the resilient member 30 and the body 28. As these spaces are reduced by the movement of control means 22 and 24 an increase in the forces provided by the resilient members 16 and 30 is obtained. Since these spaces exist during the manipulation of the bolts 26 and 40, a force is applied substantially solely to the central sections 60 and 62 of the resilient members 16 and 30 respectively. This concentration of force at the central section of these members is effective to compress the semiconductor component and the conductive bodies 14, 28 into a tight engagement at the joints 20 and 42. The forces thus provided enable a substantially uniform contact to be achieved at the respective surfaces of these members and good heat dissipation and electrical conduction results.

As illustrated in FIGS. 1 and 2, the semiconductor assembly in its fully assembled condition is characterized by the elimination of a peripheral housing or other enclosing structure. This permits ready access to and observation of the parts which are used in the variation of force generation in the assembly. In addition, the location and use of a force measuring instrument such as that shown in FIG. 1 (generally designated by the numeral 64) and a "bottoming out" preventive such as that shown in FIG. 3 (designated by the numeral 94) are facilitated by the absense of a housing or other obstructing structure.

Referring to FIG. 1, the force measuring means, generally designated 64, is shown in measuring position in the assembly 10. This force measuring means 64 is effective to measure the applied forces at the junctions 20 and 42 during the manipulation of the control means 22 and 24 by an operator. The force measuring means 64 is generally composed of three components; the indicating means generally designated 66, the reference structure generally designated 68, and a projecting part 70. The projecting part 70 engages the stationary central section 60 of the resilient member 16 and itself remains stationary during the variation of forces applied during the assembly operation. The reference structure 68 is positioned to contact the end sections 44 and 46 of the resilient member 16 so that it moves with these end sections as the forces are varied, and hence moves relative to the part 70. In the embodiment here shown the reference structure 68 comprises a horseshoe shaped magnet 72 and two laterally extending plates 74 and 76 which are composed of a ferrous material, and are therefore firmly attached to the magnet 72. The plates are also magnetically joined to the member 16 by the strong force of magnet 72. The relative movement of the reference structure 68 and the projecting part 70 is translated into a force indication on indicating means 66. For this purpose the indicating means 66 is provided with a pointer 78 and a plurality of calibrated index marks 79. The part 70 is operatively connected to the indicating means 66 in a conventional manner so that movement of the reference structure 68 relative to the part 70 will shift the pointer 78 along the index marks on the indicating means 66 directly in proportion to the degree of movement of the end sections 44 and 46 thereby providing a direct force indication.

Typical initial and final positions of the resilient member 16 and the reference structure 68 may be observed by referring to FIGS.3 and 1 respectively. As shown in FIG. 3 the spaces 52 and 54 are large. In FIG. 1 which illustrates a final position of the resilient member 16 corresponding to the application of a desired pressure on the semiconductor component, the spaces 52 and 54 have been reduced considerably during the application of force by the adjustment of bolts 26 and 40.

Once the assembly of semiconductor component and bodies 14 and 28 has been suitably pressurized through the use of the resilient members 16 and 30 and the control means 22 and 24, and the semiconductor component is electrically actuated in the circuit in which it is connected, a voltage potential will appear between the thermally conductive bodies 14 and 28. This voltage potential, which may be as high as 1000 volts or more, results from the connection of bodies 14 and 28 to separate parts of the semiconductor, that is, at the junctions 20 and 42. It will be observed that the bolts 26 and 40 are in electrical contact with the member 30 and the electrically conductive body 28 through the connection of the nuts 32 and 38 to the plate 34. Generally all of these parts are composed of electrically conductive materials, and thus are electrically connected together. Since such a high potential difference appears between bodies 14 and 28, the bolts must be carefully insulted from the body 14. In order to effect the proper electrical insulation elongated tubes 82 and 83 enclose the bolts 26 and 40 respectively and separate these bolts from the body 14 and the resilient member 16. These tubes may be composed of a relatively inexpensive insulating material such as nylon. They are also useful for guiding the bolts 26 and 40 during the manipulation thereof in the assembly process. Additional insulation is provided by members 84 and 85 which are positioned between the resilient member 16 and the bolt heads 86 and 87. Washers 88 and 89 may be interposed between the bolt heads 86 and 87 and the members 84 and 85 to provide an even distribution of the force from the bolt heads as applied by the operator during the adjusting procedure. The members 84 and 85 are composed of a material different than that of the guide tubes 82 and 83, since these members are also employed to transmit the force from the bolt heads 86 and 87 to the resilient member 16. A typical material which provides both electrical insulation and pressure resisting properties is steatite, a commercially available ceramic material. Insulating tubes 90 and 91 are operatively connected to members 84 and 85 to further insulate the bolt heads from the remainder of the assembly, thereto to prevent arcing between adjacent parts.

Since there are two separate means for increasing the pressure on the semiconductor component, i.e. control means 22 and 24, there is a possibility that the applied force of one of these control devices may be varied to a greater extent than the other. Particular difficulty would result if the spaces 52, 54, 56 or 58 between an end section and the body 14 were to be closed completely by either of these control means. This so-called "bottoming out" would generally be accompanied by an excessive force on the semiconductor component causing the possible destruction thereof. In order to minimize this possibility a thin member 94 is illustrated in FIG. 3 positioned between the end section 46 of member 16 and the body 14. This resilient member prevents the "bottoming out" of end section 46. When contact is made between the end section 46 and the member 94, the member 94 is withdrawn from the space 54 and no further adjustment of the control means 24 is carried out. A similar member may be employed in spaces 52, 56 and 58 for the same purpose. Thus, the spaces 52, 54, 56 and 58 are reduced in size during the application of force to the control means 22 and 24 to a distance no less than the thickness of the member 94, thereby eliminating the possibility of closing these spaces completely.

From the foregoing it will be appreciated that the semiconductor assembly is characterized by an excellent heat dissipation capability due to the balanced and properly pressurized contact between thermally conductive plates and the semiconductor components. The assembly is compact and narrow in dimension, so that it may readily be placed between fins of most currently available heat sink devices. In addition, no obstructing casing or housing is employed thereby permitting ready access to and observation of the parts during the assembly process. Electrical insulation is maintained and pressure application is effected by a combination of parts operatively connected to the control means. The assembly is further characterized by the low cost of manufacture which is primarily due to the reduction in the complexity of the assembly and the use of relatively inexpensive parts which are individually designed to perform specific functions in the assembly. Furthermore, by the addition of a force measuring means an exact indication of pressure on the semiconductor component may be observed at all times during the assembly process, thereby ensuring proper contact of parts and permitting efficient large scale production of such assemblies.

While only a single embodiment of the invention has been described herein, many modifications thereof may be made without departing from the scope of the invention. As one example of such modifications, the assembly may readily be used with other similar assemblies to form a multiple array of semiconductors. Such an array would be typically arranged to form a groyp of stacked semiconductors properly spaced and insulated from each other. Other modifications will be apparent to those skilled in the semiconductor art.

I claim:

1. A semiconductor assembly comprising a semiconductor component, a first body having an aperture therein and operatively connected to a first part of said semiconductor component, a second body having an aperture therein and operatively connected to a second part of said semiconductor component, a resilient member having an aperture therein and having a first surface and a second surface, one of said surfaces operatively engaged with one of said bodies, first insulator means having a part engaging the other of said surfaces of said resilient member, said first insulator means extending through said apertures in said resilient member and said first and second bodies, first bolt means positioned within said insulator means and operatively connected to said first and second bodies, the upper portion of said first bolt means being operatively connected to said part of said first insulator means and being spaced from said surface of said resilient member by said part.

2. The assembly of claim 1, in which said resilient member has first and second end sections each having an aperture therein, and in which said first insulator means and said first bolt means pass through one of said apertures in an end section, a second insulator means extending through the other of said apertures in said end section and through said first and second bodies and having a part engaging said surface of said member, second bolt means positioned within said second insulator means and operatively connected to said first and second bodies, the upper portion of said second bolt means being operatively connected to said part of said second insulator means and spaced from said surface of said resilient member by said part, the upper parts of said first and second bolt means being freely spaced from each other.

3. The assembly of claim 1, in which said insulator means comprises a guide tube and the upper part of said insulator means comprises an annular member operatively connected to said guide tube.

4. The assembly of claim 3, in which said guide tube is composed of a first material effective to provide electrical insulation between said first and second bodies, and said annular member is composed of a second material effective to provide electrical insulation between the upper portion of said bolt means and said resilient member, and to transmit the compressive force applied to said upper portion of said bolt means.

* * * * *